US012683584B2

(12) United States Patent
Hamasaki

(10) Patent No.: US 12,683,584 B2
(45) Date of Patent: Jul. 14, 2026

(54) FILTER AND MULTIPLEXER

(71) Applicant: TAIYO YUDEN CO., LTD., Tokyo (JP)

(72) Inventor: Jyunichi Hamasaki, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 63 days.

(21) Appl. No.: 18/973,795

(22) Filed: Dec. 9, 2024

(65) Prior Publication Data

US 2025/0309864 A1 Oct. 2, 2025

(30) Foreign Application Priority Data

Mar. 26, 2024 (JP) ................................. 2024-049572

(51) Int. Cl.
*H03H 9/64* (2006.01)

(52) U.S. Cl.
CPC ............ *H03H 9/6433* (2013.01); *H03H 9/64* (2013.01); *H03H 9/6443* (2013.01)

(58) Field of Classification Search
CPC ....... H03H 9/6433; H03H 9/64; H03H 9/6443
USPC ......................................................... 333/193
See application file for complete search history.

(56) References Cited

U.S. PATENT DOCUMENTS

| | | | |
|---|---|---|---|
| 2007/0120626 A1 | 5/2007 | Makibuchi et al. | .......... 333/193 |
| 2010/0109802 A1 | 5/2010 | Tanaka | .......... 333/133 |
| 2013/0141185 A1 | 6/2013 | Tsutsumi | .......... 333/133 |
| 2020/0321941 A1 | 10/2020 | Genji | .......... H03H 9/64 |

FOREIGN PATENT DOCUMENTS

| | | | |
|---|---|---|---|
| JP | 2007-181195 A | | 7/2007 |
| JP | 2010-109694 A | | 5/2010 |
| JP | 2013-118584 A | | 6/2013 |
| JP | 2017022744 A | * | 1/2017 |
| WO | WO 2019/131533 A1 | | 7/2019 |

* cited by examiner

*Primary Examiner* — Andrea Lindgren Baltzell
*Assistant Examiner* — Victor Cole
(74) *Attorney, Agent, or Firm* — Stein IP, LLC

(57) ABSTRACT

A filter includes a piezoelectric substrate, a multimode filter provided on the piezoelectric substrate, the multimode filter including input IDTs and output IDTs, the input IDTs being connected to an input terminal, the output IDTs being connected to an output terminal and arranged alternately with the input IDTs, and an inductor having a first end, which is connected to two or more and half or less IDTs of the input IDTs and the output IDTs, and a second end connected to a ground, the two or more and half or less IDTs including at least one input IDT of the input IDTs and at least one output IDT of the output IDTs.

8 Claims, 16 Drawing Sheets

EMBODIMENT 1

FIG. 1A    EMBODIMENT 1

FIG. 3A　COMPARATIVE EXAMPLE 1

FIG. 3B　COMPARATIVE EXAMPLE 2

--◈--- 1(INPUT IDT: 0, OUTPUT IDT: 1)     —◇— 6(INPUT IDT: 3, OUTPUT IDT: 3)

—◆— 2(INPUT IDT: 1, OUTPUT IDT: 1)     —✳— 7(INPUT IDT: 3, OUTPUT IDT: 4)

—✳— 3(INPUT IDT: 1, OUTPUT IDT: 2)     --△--- 8(INPUT IDT: 4, OUTPUT IDT: 4)

--▲--- 4(INPUT IDT: 2, OUTPUT IDT: 2)     —○— 9(INPUT IDT: 4, OUTPUT IDT: 5)

—●— 5(INPUT IDT: 2, OUTPUT IDT: 3)     --■-- 10(INPUT IDT: 5, OUTPUT IDT: 5)

—— 11(INPUT IDT: 5, OUTPUT IDT: 6)

--◈--- 1(INPUT IDT: 0, OUTPUT IDT: 1)      —◇— 6(INPUT IDT: 3, OUTPUT IDT: 3)

—◆— 2(INPUT IDT: 1, OUTPUT IDT: 1)      —✱— 7(INPUT IDT: 3, OUTPUT IDT: 4)

—✱— 3(INPUT IDT: 1, OUTPUT IDT: 2)      --△-- 8(INPUT IDT: 4, OUTPUT IDT: 4)

--▲-- 4(INPUT IDT: 2, OUTPUT IDT: 2)      —○— 9(INPUT IDT: 4, OUTPUT IDT: 5)

—●— 5(INPUT IDT: 2, OUTPUT IDT: 3)      --■-- 10(INPUT IDT: 5, OUTPUT IDT: 5)

——— 11(INPUT IDT: 5, OUTPUT IDT: 6)

VARIATION 1 OF EMBODIMENT 1

VARIATION 2 OF EMBODIMENT 1

VARIATION 3 OF EMBODIMENT 1

EMBODIMENT 4

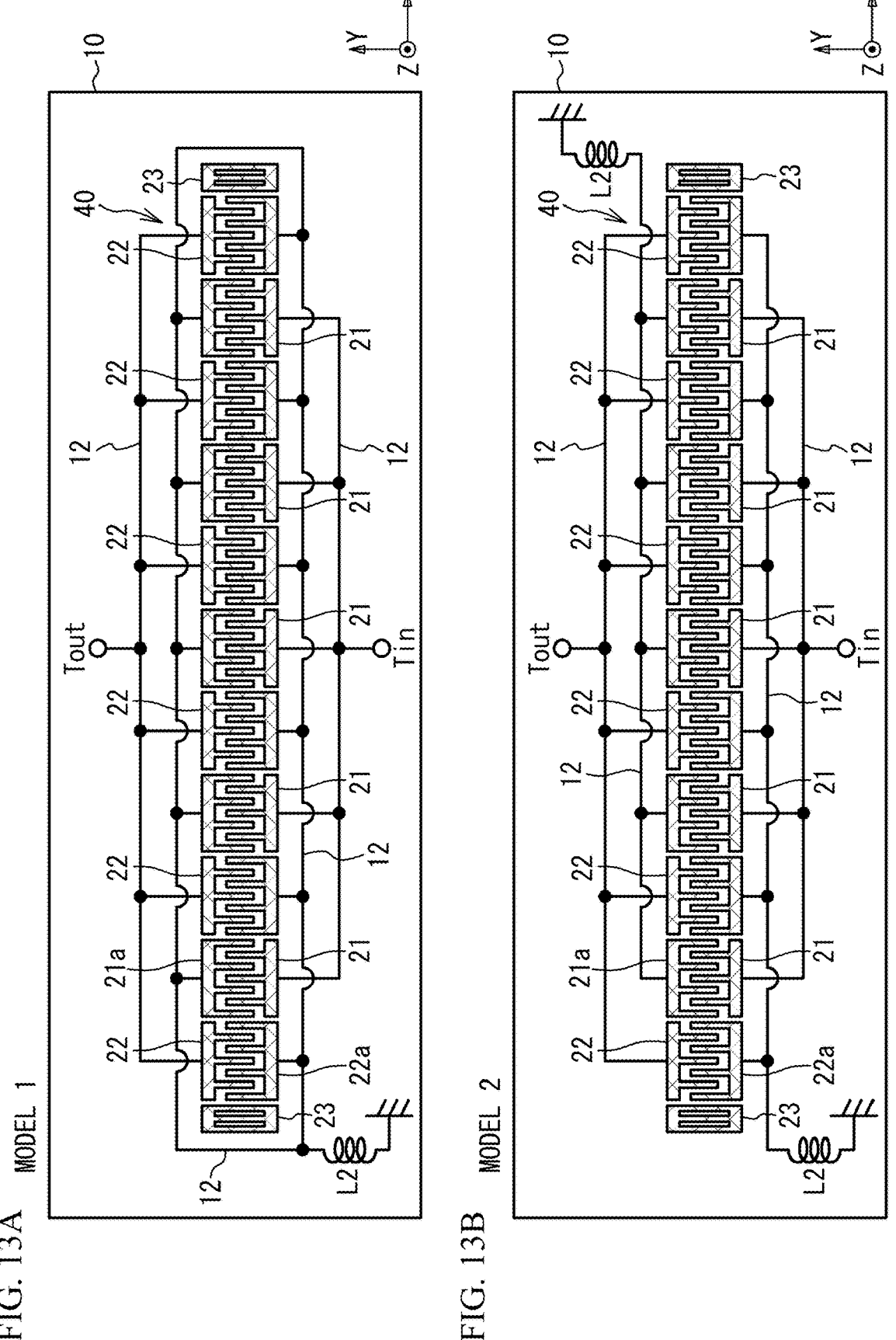
FIG. 13A   MODEL 1
FIG. 13B   MODEL 2

FILTER AND MULTIPLEXER

CROSS-REFERENCE TO RELATED APPLICATION

This application is based upon and claims the benefit of priority of the prior Japanese Patent Application No. 2024-049572, filed on Mar. 26, 2024, the entire contents of which are incorporated herein by reference.

FIELD

A certain aspect of the present disclosure relates to a filter and a multiplexer.

BACKGROUND

A multimode filter in which a plurality of interdigital transducers (IDTs) are arranged in a propagation direction of a surface acoustic wave (SAW) is known. As a multimode filter, a longitudinally coupled dual mode SAW filter (DMS) is known as disclosed in, for example, Japanese Patent Application Laid-Open No. 2013-118584, International Publication No. 2019/131533, and Japanese Patent Application Laid-Open Nos. 2010-109694 and 2007-181195 (Patent Documents 1 to 4, respectively). For example, it is known that the frequency of the attenuation pole on the high-frequency side of the passband is changed by connecting an inductor between a plurality of IDTs of a multimode filter and a ground, as disclosed in, for example, Patent Document 1.

SUMMARY

When an inductor is connected between a plurality of IDTs and a ground as described in Patent Document 1, the frequency of the attenuation pole on the low-frequency side as well as the frequency of the attenuation pole on the high-frequency side of the passband changes. However, the amount of change in the frequency of the attenuation pole with respect to the change in the inductance is large, and it is difficult to adjust the frequency of the attenuation pole. Therefore, the desired attenuation characteristics on the low-frequency side of the passband may not be achieved.

In one aspect of the present disclosure, there is provided a filter including: a piezoelectric substrate; a multimode filter provided on the piezoelectric substrate, the multimode filter including input IDTs and output IDTs, the input IDTs being connected to an input terminal, the output IDTs being connected to an output terminal and arranged alternately with the input IDTs; and an inductor having a first end, which is connected to two or more and half or less IDTs of the input IDTs and the output IDTs, and a second end connected to a ground, the two or more and half or less IDTs including at least one input IDT of the input IDTs and at least one output IDT of the output IDTs.

In another aspect of the present disclosure, there is provided a multiplexer including the above filter.

BRIEF DESCRIPTION OF THE DRAWINGS

FIG. 1A is a plan view of a longitudinally coupled double mode SAW filter (DMS) in accordance with an embodiment 1.

FIG. 3A and FIG. 3B are plan views of DMSs in comparative examples 1 and 2, respectively;

FIG. 13A and FIG. 13B are plan views of models 1 and 2 on which simulations were performed, respectively;

DETAILED DESCRIPTION

Hereinafter, embodiments of the present disclosure will be described with reference to the drawings.

Embodiment 1

Figure 1B:
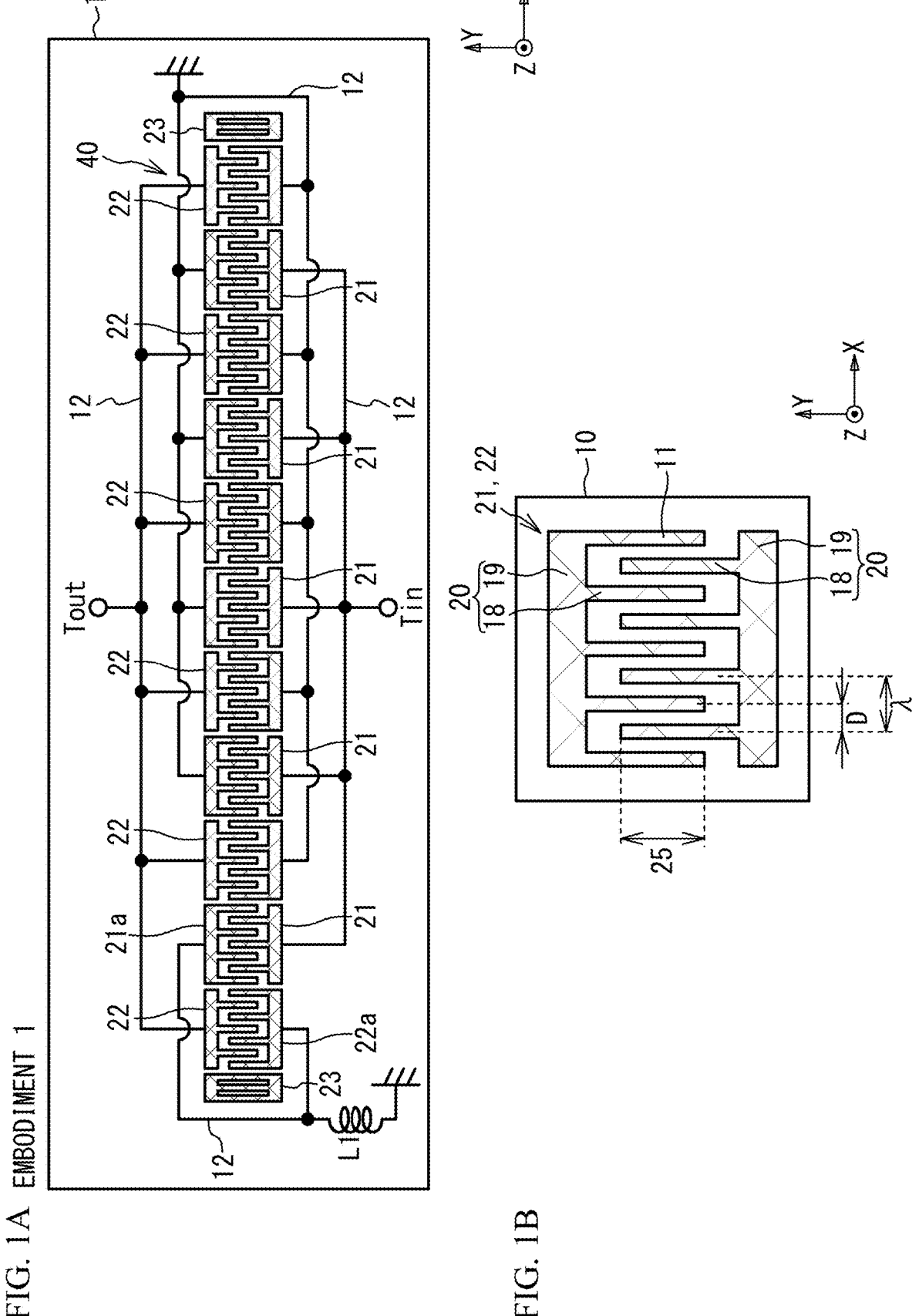
FIG. 1B is a plan view of an input IDT and an output IDT.

FIG. 1A is a plan view of a longitudinally coupled double mode SAW filter (DMS) 40 in accordance with an embodiment 1, and FIG. 1B is a plan view of an input interdigital transducer (IDT) 21 and an output IDT 22. The direction in which electrode fingers 18 are arranged (arrangement direction) is defined as an X direction, the direction in which the electrode fingers 18 extend (extending direction) is defined as a Y direction, and the thickness direction of a piezoelectric substrate 10 is defined as a Z direction. The X direction and the Y direction do not necessarily correspond to the X-axis orientation and the Y-axis orientation of the crystal orientations of the piezoelectric substrate 10. When the piezoelectric substrate 10 is a rotated Y-cut X-propagation substrate, the X-direction is the X-axis orientation of the crystal orientations.

As illustrated in FIG. 1A, a plurality of input IDTs 21, a plurality of output IDTs 22, and a pair of reflectors 23 are provided on the piezoelectric substrate 10. The inputs IDTs 21 are connected to an input terminal Tin. The outputs IDTs 22 are connected to an output terminal Tout. The input IDTs 21 and the output IDTs 22 are alternately arranged in the X direction. The reflectors 23 are provided so as to sandwich the input IDTs 21 and the output IDTs 22 therebetween in the X direction. The number of the input IDTs 21 and output IDTs 22 is set as appropriate.

As illustrated in FIG. 1B, the input IDTs 21 and the output IDTs 22 are formed of a metal film 11 provided on the piezoelectric substrate 10. Each of the input IDTs 21 and output IDTs 22 includes a pair of comb-shaped electrodes 20 facing each other. Each comb-shaped electrode 20 includes a plurality of electrode fingers 18 and a bus bar 19 to which the electrode fingers 18 are connected. The region where the electrode fingers 18 of one of the pair of comb-shaped electrodes 20 overlap the electrode fingers 18 of the other of the pair of comb-shaped electrodes 20 is an overlap region 25. The length of the overlap region 25 is the aperture length. The electrode fingers 18 of one of the pair of comb-shaped electrodes 20 and the electrode fingers 18 of the other of the pair of comb-shaped electrodes 20 are alternately provided one by one in at least a part of the overlap region 25. The acoustic wave excited mainly by the electrode fingers 18 in the overlap region 25 propagates mainly in the X direction. The pitch of the electrode fingers 18 of one of the pair of comb-shaped electrodes 20 is approximately equal to the wavelength 2 of the acoustic wave. When the pitch of the electrode fingers 18 (the pitch between the centers of the electrode fingers 18) is D, the pitch of the electrode fingers 18 of one comb-shaped electrode 20 is twice the average pitch D. The average pitch D can be calculated by dividing the width of the input IDT 21 or the output IDT 22 in the X direction by the number of the electrode fingers 18.

The piezoelectric substrate 10 is, for example, a monocrystalline lithium tantalate (LiTaO$_3$) substrate, a monocrystalline lithium niobate (LiNbO$_3$) substrate, or a monocrystalline quartz substrate. The piezoelectric substrate 10 may be, for example, a rotated Y-cut X-propagation lithium tantalate substrate or a rotated Y-cut X-propagation lithium niobate substrate. The metal film 11 is a film containing, for example, aluminum (Al), copper (Cu), or molybdenum (Mo) as a main component. An adhesion film such as a titanium (Ti) film, a chromium (Cr) film, or a titanium nitride (TiN) film may be provided between the electrode fingers 18 and the piezoelectric substrate 10. The adhesion film is thinner than the electrode fingers 18. An insulating film may be provided so as to cover the electrode fingers 18. The insulating film may function as a passivation film or a temperature compensation film.

As illustrated in FIG. 1A, the input IDTs 21, the output IDTs 22, and the pair of reflectors 23 are arranged in the X direction, which is the propagation direction of the acoustic wave excited by the input IDTs 21 and the output IDTs 22. The acoustic wave excited by the input IDTs 21 and the output IDTs 22 is reflected by the reflectors 23. Thus, the energy of the acoustic wave is confined in the input IDTs 21 and the output IDTs 22. A bandpass filter is formed by utilizing two vibration modes of first order and third order generated by acoustic coupling between the input IDTs 21 and the output IDTs 22.

First comb-shaped electrodes 20 of the input IDTs 21 are coupled to the input terminal Tin by wiring lines 12. First comb-shaped electrodes 20 of the output IDTs 22 are coupled to the output terminal Tout by the wiring lines 12. A second comb-shaped electrode 20 of an output IDT 22a, which is located outermost in the X direction among the input IDTs 21 and the output IDTs 22, and a second comb-shaped electrode 20 of an input IDT 21a, which is located next to the output IDT 22a, are connected to a first end of an inductor L1 by the wiring lines 12. A second end of the inductor L1 is connected to a ground. The inductor L1 may be formed of a chip or may be formed of a conductive pattern (a conductive line). This will be described later.

Second comb-shaped electrodes 20 of the remaining input IDTs 21 other than the input IDT 21a among the input IDTs 21 and second comb-shaped electrodes 20 of the remaining output IDTs 22 other than the output IDT 22a among the output IDTs 22 are coupled to a ground by the wiring lines 12 without passing through the inductor L1. The wiring lines 12 coupled to the input terminal Tin and the output terminal Tout and the wiring lines 12 coupled to the ground make a multi-level crossing and are not in contact with each other.

Figures 2A, 2B:
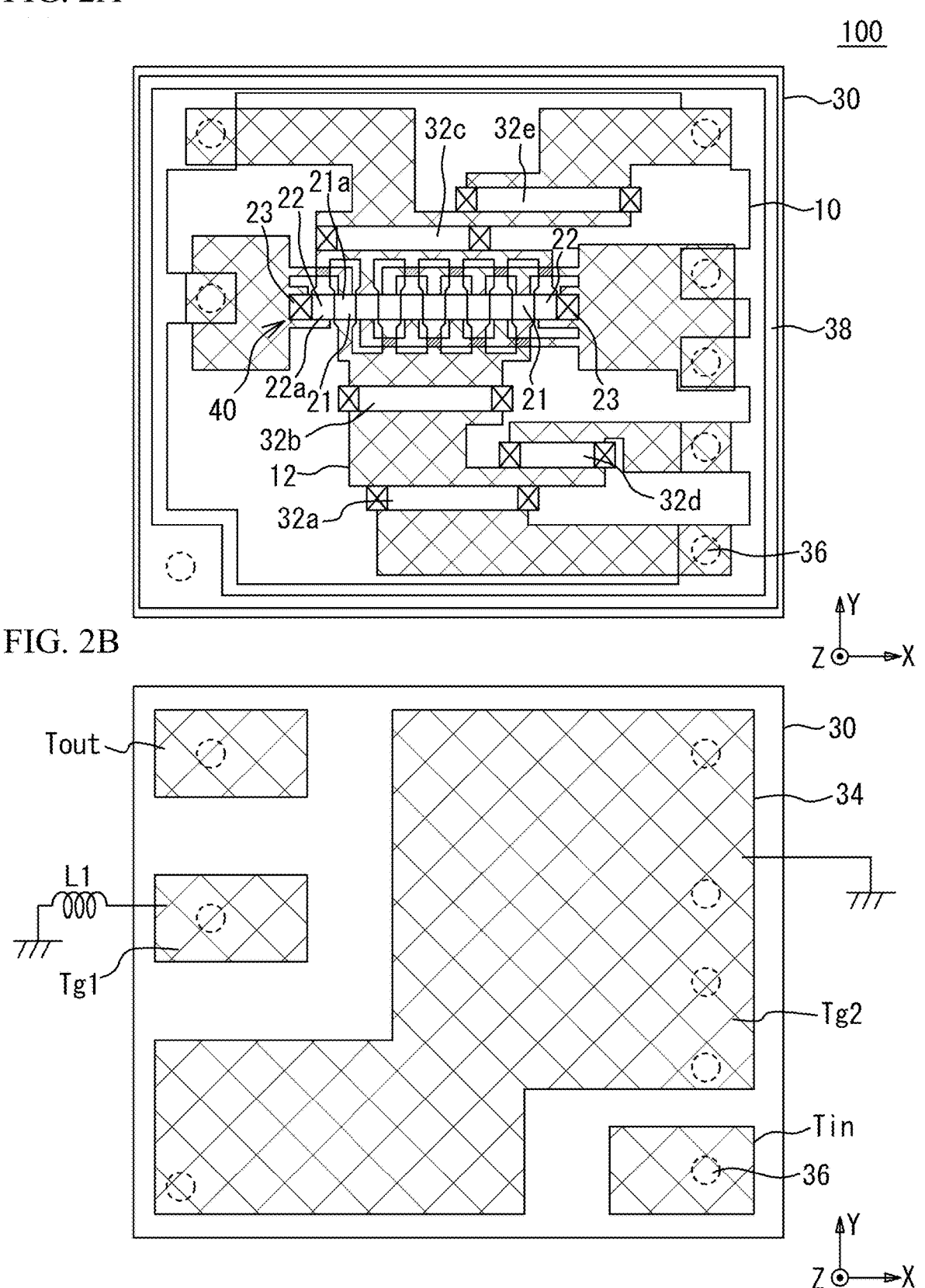
FIG. 2A is a plan view of a filter in accordance with the embodiment 1.
FIG. 2B is a plan view of the lower surface of a support substrate.

FIG. 2A is a plan view of a filter 100 in accordance with the embodiment 1, and FIG. 2B is a plan view of the lower surface of a support substrate 30. FIG. 2B illustrates terminals 34 provided on the lower surface of the support substrate 30 as seen through the support substrate 30 from the +Z direction. As illustrated in FIG. 2A and FIG. 2B, the piezoelectric substrate 10 is bonded to the upper surface of the support substrate 30. The support substrate 30 is, for example, a sapphire substrate, an alumina substrate, a spinel substrate, a quartz substrate, a crystal substrate, a silicon carbide substrate, or a silicon substrate. An insulating film such as a silicon oxide film and/or an aluminum oxide film may be provided between the piezoelectric substrate 10 and the support substrate 30. As described above, the piezoelectric substrate 10 is directly or indirectly bonded to the upper surface of the support substrate 30.

A plurality of the terminals 34 are provided on the lower surface of the support substrate 30. The terminals 34 include the input terminal Tin, the output terminal Tout, and ground terminals Tg1 and Tg2. In addition to the DMS 40, acoustic wave resonators 32a to 32e are provided on the piezoelectric substrate 10. The DMS 40 and the acoustic wave resonators 32a to 32c are connected in series between the input terminal Tin and the output terminal Tout through the wiring lines 12 and via wirings 36 penetrating through the support substrate 30. The acoustic wave resonator 32d is connected between the ground terminal Tg2 and the wiring line 12 between the acoustic wave resonators 32a and 32b. The acoustic wave resonator 32e is connected between the ground terminal Tg2 and the wiring line 12 between the acoustic wave resonator 32c and the output terminal Tout. In FIG. 2A, the three-dimensional wiring illustrated in FIG. 1A is indicated by fine hatching.

The wiring line 12 connected to the output IDT 22a, which is located outermost in the X direction among the input IDTs 21 and output IDTs 22, and the wiring line 12 connected to the input IDT 21a, which is located next to the output IDT 22a, are combined into one and connected to the ground terminal Tg1 through the via wiring 36. The first end of the inductor L1 is connected to the ground terminal Tg1. The second end of the inductor L1 is connected to the ground.

The wiring lines 12 connected to the remaining input IDTs 21 other than the input IDT 21a among the input IDTs 21 and the wiring lines 12 connected to the remaining output IDTs 22 other than the output IDT 22a among the output IDTs 22 are combined into one and connected to the ground terminal Tg2 through the via wiring 36. The ground terminal Tg2 is connected to the ground without passing through the inductor L1. The wiring lines 12, the terminals 34, and the via wirings 36 are single-layer films or multilayer films including a conductive film such as an aluminum (Al) film, a copper (Cu) film, or a gold (Au) film.

The piezoelectric substrate 10 is not provided in the peripheral region of the support substrate 30. A frame body 38 surrounding the piezoelectric substrate 10 in a plan view as viewed from the Z direction is provided in the peripheral region of the support substrate 30. The frame body 38 is a metal layer containing, for example, copper, nickel, kovar, gold, aluminum, and/or tungsten. A lid is provided on the frame body 38, but is not illustrated here. The DMS 40 and the acoustic wave resonators 32a to 32e are sealed by the frame body 38 and the lid in a void space formed between the piezoelectric substrate 10 and the lid.

Comparative Examples

Figures 3A, 3B:
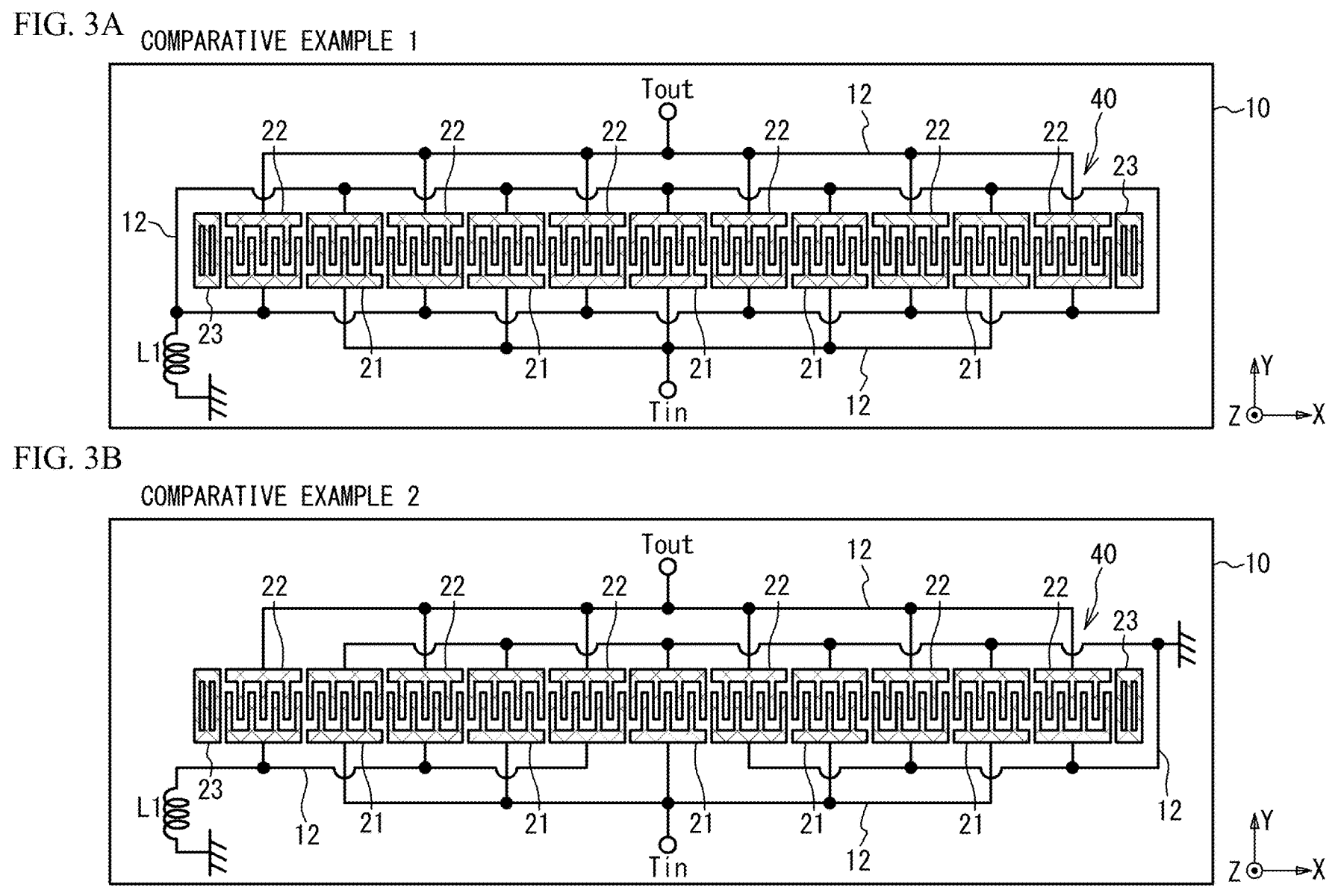

FIG. 3A is a plan view of the DMS 40 in a comparative example 1. As illustrated in FIG. 3A, in the comparative example 1, all of the input IDTs 21 and output IDTs 22 are connected to a first end of the inductor L1 by the wiring lines 12. A second end of the inductor L1 is connected to a ground. Other configurations are the same as those of the embodiment 1, and thus the description thereof will be omitted.

FIG. 3B is a plan view of the DMS 40 in a comparative example 2. As illustrated in FIG. 3B, in the comparative example 2, half of the output IDTs 22 are connected to a first end of the inductor L1 by the wiring lines 12. A second end of the inductor L1 is connected to a ground. The input IDTs 21 and the remaining output IDTs 22 of the output IDTs 22 are connected to a ground by the wiring lines 12 without passing through the inductor L1. Other configurations are the same as those of the embodiment 1, and thus the description thereof will be omitted.

Simulation 1

Simulated were transmission characteristics of the DMSs 40 in the embodiment 1, the comparative example 1, and the comparative example 2. The simulation conditions are as follows.

Piezoelectric substrate 10: 42°-rotated Y-cut X-propagation lithium tantalate substrate
Metal film 11: Aluminum film with a thickness of 131 nm
Number of the input IDTs 21: 5
Number of the output IDTs 22: 6
Inductance of the inductor L1: 0 nH, 1 nH, 2 nH, 3 nH
Passband: Reception band of Band 66 (2110 MHz to 2200 MHz)
Stopband: Transmission band of Band 1 (1920 MHz to 1980 MHz) and transmission band of Band 3 (1710 MHz to 1785 MHz)

Figures 4A, 4B:
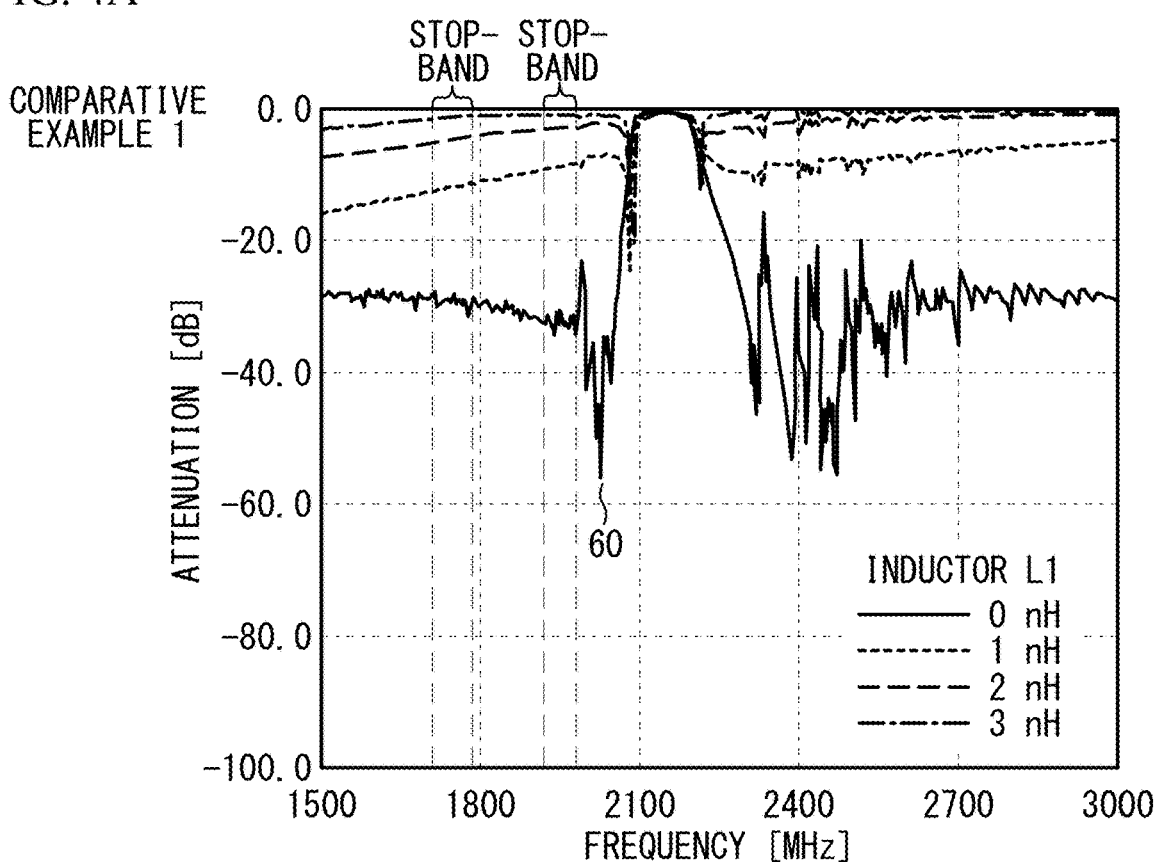
FIG. 4A presents simulation results of attenuation versus frequency in the comparative example 1.
FIG. 4B is an enlarged view around the passband in FIG. 4A.
Figure 5A:
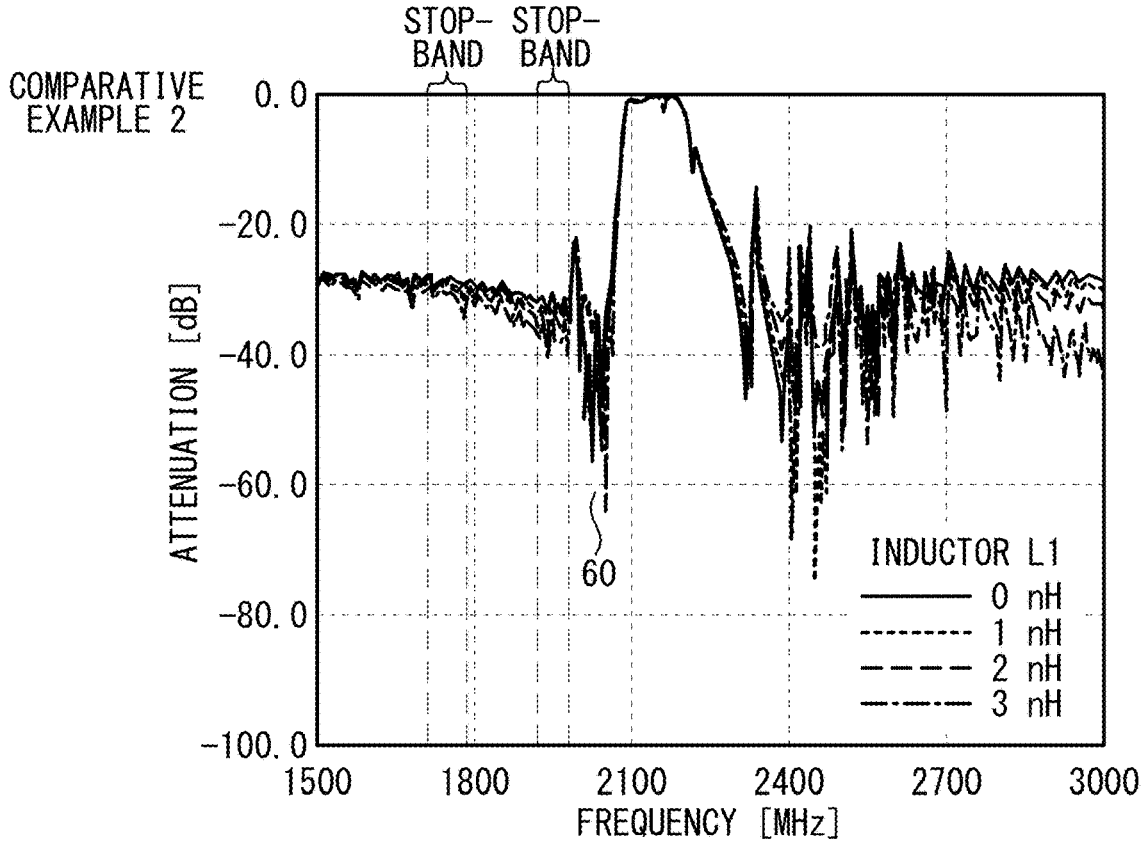
FIG. 5A presents simulation results of attenuation versus frequency in the comparative example 2.
Figure 5B:
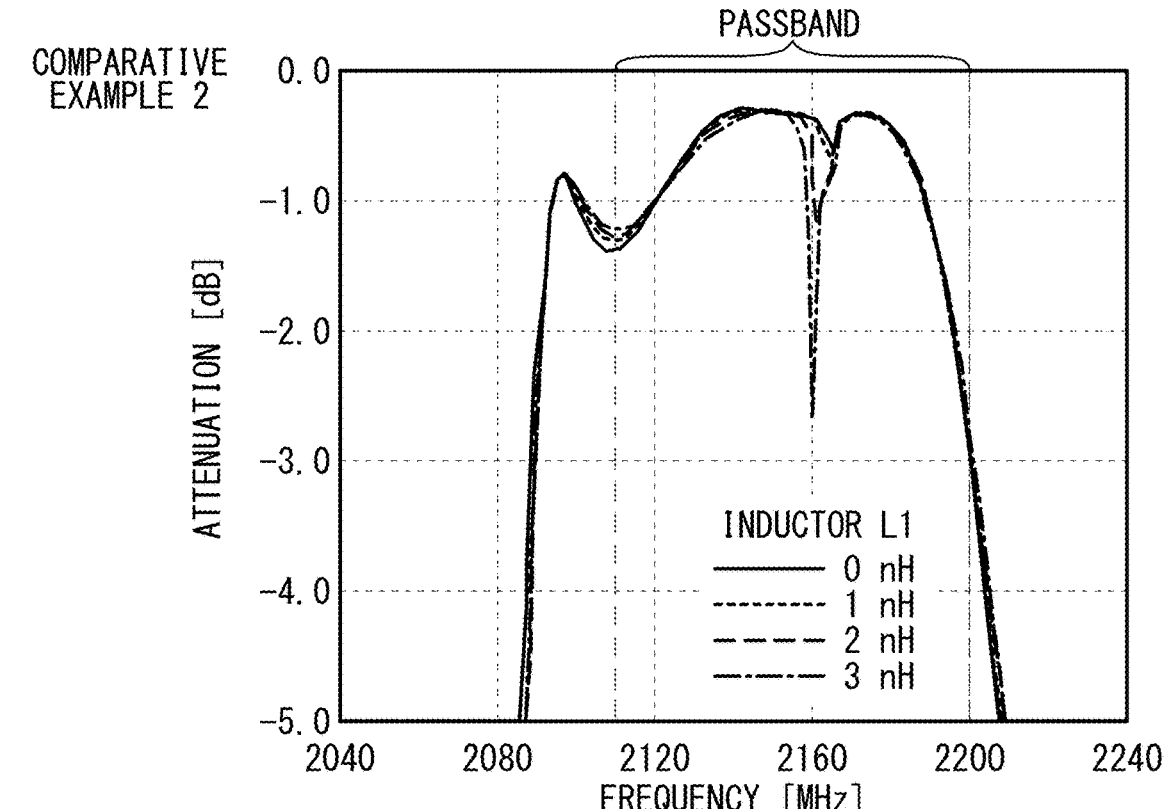
FIG. 5B is an enlarged view around the passband in FIG. 5A.
Figures 6A, 6B:
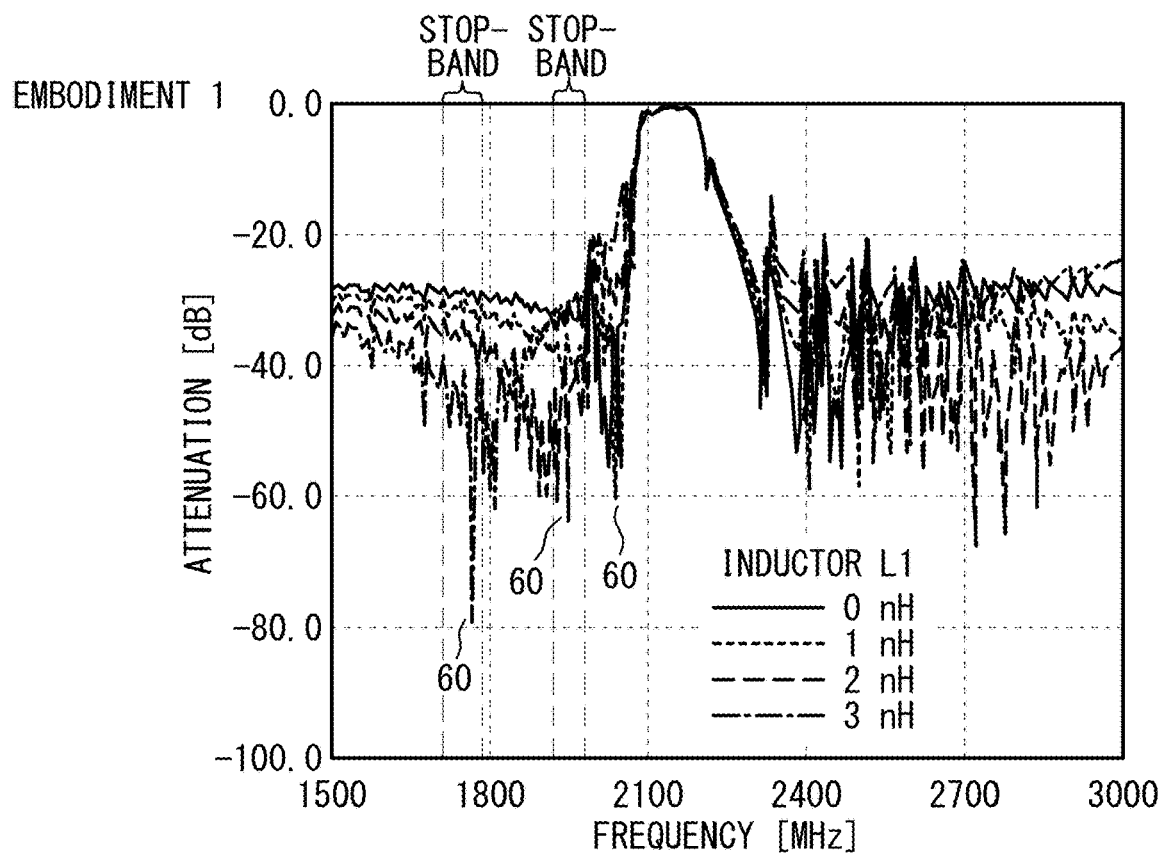
FIG. 6A illustrates simulation results of attenuation versus frequency in the embodiment 1.
FIG. 6B is an enlarged view around the passband in FIG. 6A.

FIG. 4A presents simulation results of attenuation versus frequency in the comparative example 1, and FIG. 4B is an enlarged view around the passband in FIG. 4A. FIG. 5A presents simulation results of attenuation versus frequency in the comparative example 2, and FIG. 5B is an enlarged view around the passband in FIG. 5A. FIG. 6A presents simulation results of attenuation versus frequency in the embodiment 1, and FIG. 6B is an enlarged view around the passband in FIG. 6A. In FIG. 4A, respective attenuation poles 60 on the low-frequency side of the passband in the cases where the inductance of the inductor L1 is 1 nH, 2 nH, and 3 nH are not presented because they are at frequencies lower than 1500 MHz.

As presented in FIG. 4A, in the comparative example 1, the amount of change in the frequency of the attenuation pole 60 with respect to the change in the inductance of the inductor L1 is large. Therefore, it is difficult to adjust the frequency of the attenuation pole 60 by adjusting the inductance of the inductor L1, and it is difficult to obtain desired attenuation characteristics on the low-frequency side of the passband. As presented in FIG. 5A, in the comparative example 2, even when the inductance of the inductor L1 is changed, the frequency of the attenuation pole 60 is hardly changed. Even in this case, it is difficult to adjust the frequency of the attenuation pole 60 by adjusting the inductance of the inductor L1, and it is difficult to obtain desired attenuation characteristics on the low-frequency side of the passband. The reason why the frequency of the attenuation pole 60 hardly changed when the inductor L1 was connected to only the input IDTs 21 or the output IDTs 22 and was not connected to the other as in the comparative example 2 is considered to be that the reduction in combined impedance is mitigated due to the reduced number of IDTs connected to the inductor, leading to an effective reduction in inductance.

In contrast, as presented in FIG. 6A, in the embodiment 1, the frequency of the attenuation pole 60 is varied by varying the inductance of the inductor L1, and the amount of change in the frequency of the attenuation pole 60 with respect to the change in the inductance is small. Therefore, the attenuation pole 60 can be adjusted to be at the desired frequency by adjusting the inductance of the inductor L1, and desired attenuation characteristics can be obtained on the low-frequency side of the passband. The reason why the amount of change in the frequency of the attenuation pole 60 with respect to the change in the inductance of the inductor L1 is small in the embodiment 1 is considered to be that the reduction in the combined impedance is mitigated due to the reduced number of IDTs connected to the inductor, leading to an effective reduction in inductance.

As presented in FIG. 4B, in the comparative example 1, when the inductance of the inductor L1 varies, the loss in the passband varies. As presented in FIG. 5B, in the comparative example 2, when the inductance of the inductor L1 increases, a ripple is generated in the passband. In contrast, as presented in FIG. 6B, in the embodiment 1, even when the inductance of the inductor L1 varies, the variation in the loss in the passband is small. The reason why the variation in the loss in the passband is small even when the inductance of the inductor L1 is varied in the embodiment 1 is considered to be that the resonant frequencies of the input IDT and the output IDT are equally changed by simultaneously GND separating the input IDT and the output IDT and connecting the input IDT and the output IDT to the inductor.

Simulation 2

Simulated were transmission characteristics when the number of the input IDTs 21 and output IDTs 22 connected to the inductor L1 were varied. The simulation conditions are as follows.

Piezoelectric substrate 10: 42°-rotated Y-cut X-propagation lithium tantalate substrate
Metal film 11: Aluminum film with a thickness of 131 nm
Number of the input IDTs 21: 5
Number of the outputs IDTs 22: 6
Inductance of the inductor L1: Varies in a range of 0.1 nH to 3 nH
Passband: Reception band of Band 66 (2110 MHz to 2200 MHz)
Stopband: Transmission band of Band 1 (1920 MHz to 1980 MHz) and transmission band of Band 3 (1710 MHz to 1785 MHz)

Figure 7A:
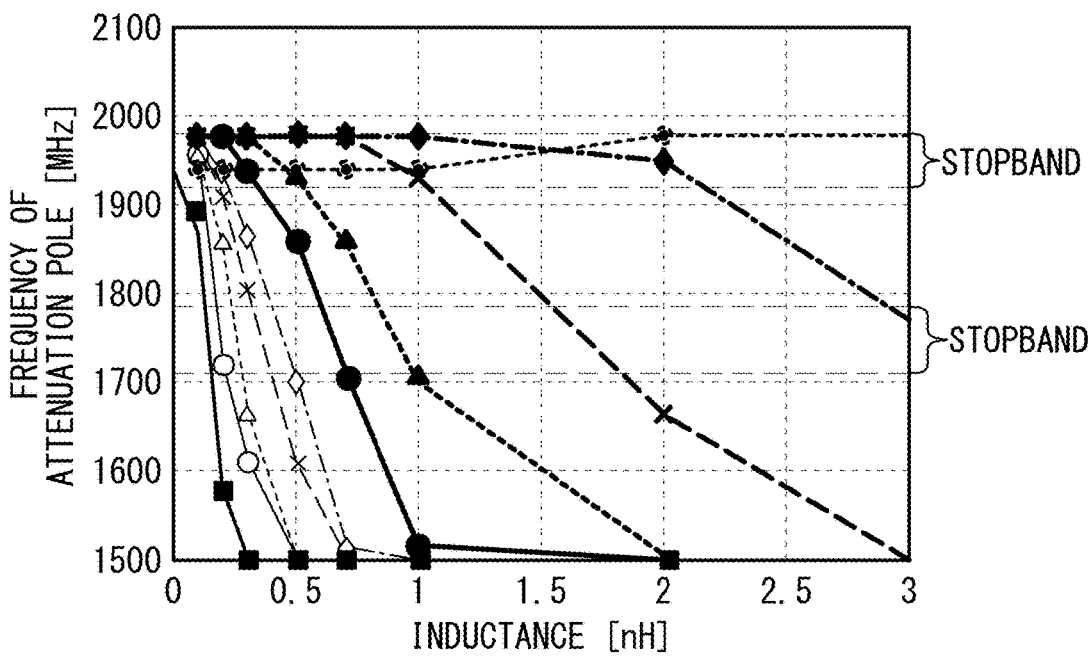
FIG. 7A presents simulation results of the frequency of the attenuation pole with respect to the inductance of an inductor when the number of input IDTs and output IDTs connected to the inductor is varied.
Figure 7B:
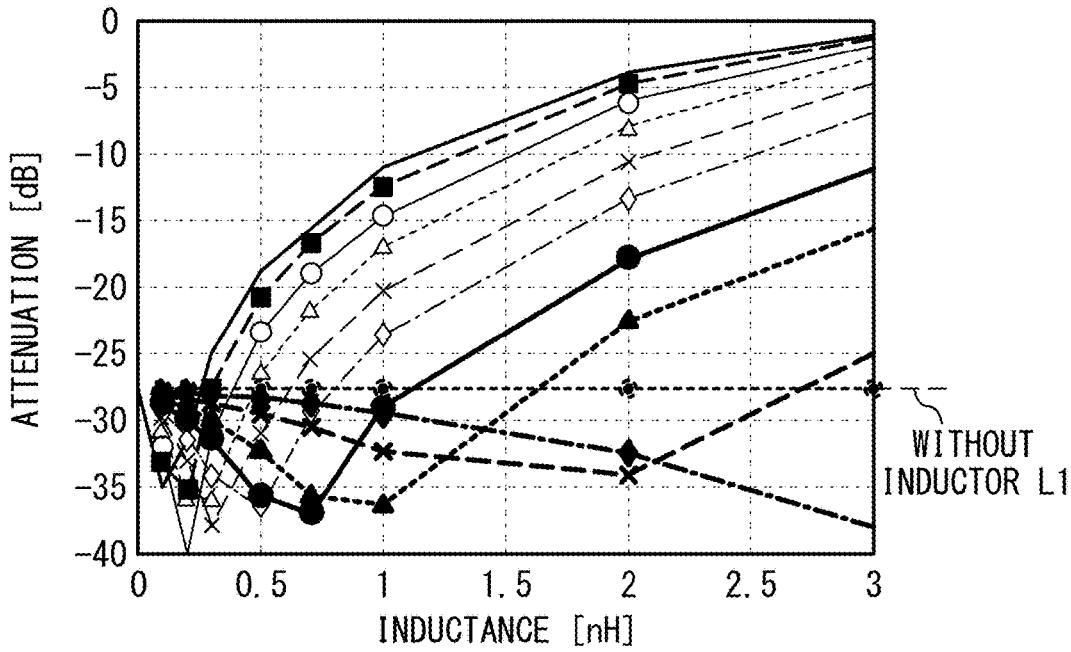
FIG. 7B presents simulation results of attenuation in the transmission band of Band 3 with respect to the inductance of the inductor.

FIG. 7A presents simulation results of the frequency of the attenuation pole 60 versus the inductance of the inductor L1 when the number of the input IDTs 21 and output IDTs 22 connected to the inductor L1 was varied. FIG. 7B presents simulation results of the attenuation in the transmission band (1710 MHz to 1785 MHz) of Band 3 versus the inductance of the inductor L1 when the number of the input IDTs 21 and output IDTs 22 connected to the inductor L1 are varied. FIG. 7B also presents the attenuation in the case where the inductor L1 is not connected.

As presented in FIG. 7A, as the number of the input IDTs 21 and output IDTs 22 connected to the inductor L1 increases, the amount of change in the frequency of the attenuation pole 60 with respect to the change in the inductance of the inductor L1 increases. To improve the attenuation characteristics, it is desirable that the frequency of the attenuation pole 60 can be adjusted to be at a desired frequency, and therefore, it is desirable that the amount of change in the frequency of the attenuation pole 60 with respect to the change in the inductance is small. Therefore, to improve the attenuation characteristics using the inductor L1, the number of the input IDTs 21 and output IDTs 22 connected to the inductor L1 is preferably two or more and half (five) or less, more preferably two or more and four or less, further preferably two or more and three or less, and most preferably two.

As presented in FIG. 7B, the attenuation in the transmission band (stopband) of Band 3 is degraded as the number of the input IDTs 21 and output IDTs 22 connected to the inductor L1 is increased. To suppress the deterioration in the attenuation, the number of the input IDTs 21 and output IDTs 22 connected to the inductor L1 is preferably two or more and three or less, and more preferably two.

Variations

Figure 8A:
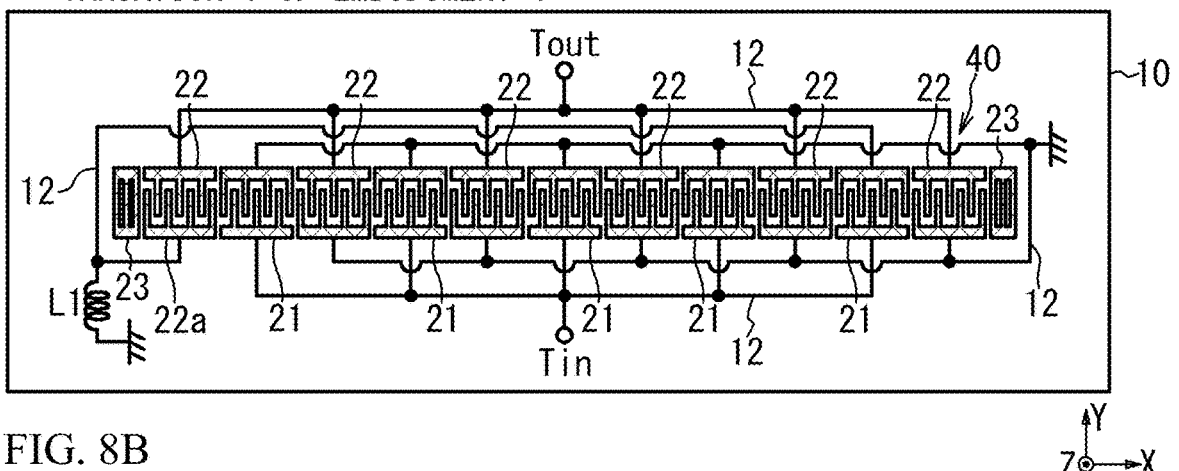
FIG. 8A to FIG. 8C are plan views of DMSs in accordance with variations 1 to 3 of the embodiment 1, respectively.

FIG. 8A is a plan view of the DMS 40 in accordance with a variation 1 of the embodiment 1. As illustrated in FIG. 8A, in the variation 1 of the embodiment 1, the inductor L1 is connected to the output IDT 22a, which is located outermost in the X direction, and the input IDT 21, which is located at a position away from the output IDT 22a. Other configurations are the same as those of the embodiment 1, and thus the description thereof will be omitted. As described above, the input IDT 21 and output IDT 22 to which the inductor L1 is connected are not necessarily next to each other, and can also be located away from each other.

Figure 8B:
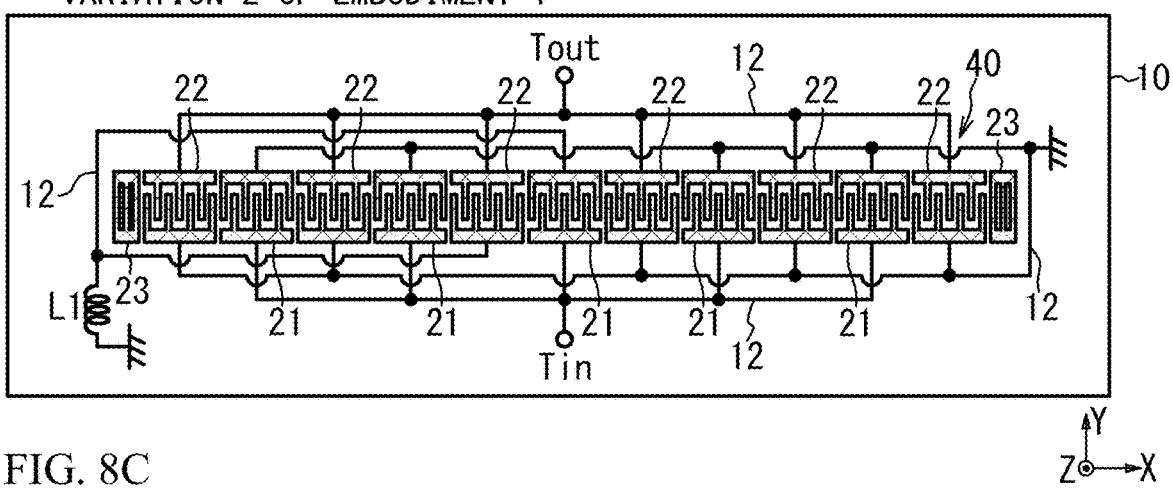

FIG. 8B is a plan view of the DMS 40 in accordance with a variation 2 of the embodiment 1. As illustrated in FIG. 8B, in the variation 2 of the embodiment 1, the inductor L1 is connected to the input IDT 21 and the output IDT 22 other than the IDTs located outermost in the X direction. Other configurations are the same as those of the embodiment 1, and thus the description thereof will be omitted. As described above, the input IDT 21 and output IDT 22 connected to the inductor L1 may be IDTs located in the inner side in the X direction.

Figure 8C:
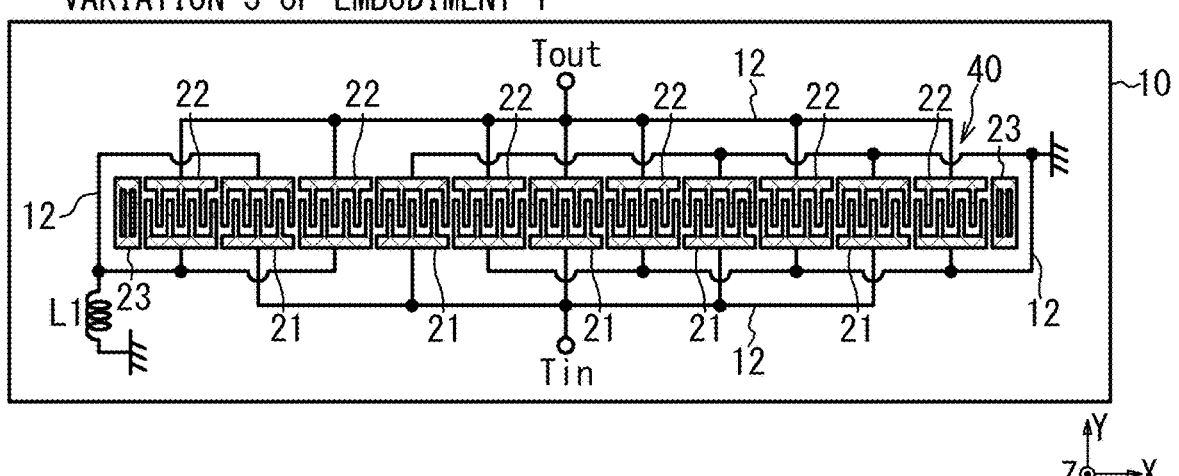

FIG. 8C is a plan view of the DMS 40 in accordance with a variation 3 of the embodiment 1. As illustrated in FIG. 8C, in the variation 3 of the embodiment 1, the inductor L1 is connected to one input IDT 21 and two output IDTs 22. Other configurations are the same as those of the embodiment 1, and thus the description thereof will be omitted. As described above, the number of the input IDTs 21 connected to the inductor L1 and the number of the output IDTs 22 connected to the inductor L1 are not necessarily the same, and may be different. The number of the input IDTs 21 connected to the inductor L1 may be greater than the number of the output IDTs 22 connected to the inductor L1.

In the embodiment 1 and the variations thereof, a first end of the inductor L1 is connected to two or more and half or less IDTs, including at least one input IDT 21 and at least one output IDT 22, of the input IDTs 21 and output IDTs 22. A second end of the inductor L1 is connected to a ground. Thus, as illustrated in FIG. 7A, the amount of change in the frequency of the attenuation pole 60 with respect to the change in the inductance of the inductor L1 is reduced, and thus the attenuation pole 60 can be adjusted to be at a desired frequency by adjusting the inductance of the inductor L1. Therefore, the attenuation characteristics on the low-frequency side of the passband can be improved. Half or less of the input IDTs 21 and output IDTs 22 means equal to or less than the number obtained by dividing the total number of the input IDTs 21 and the output IDTs 22 by 2, and rounding down the obtained value to the nearest whole number.

In the embodiment 1 and the variations thereof, the inductor L1 is connected to two or more and three or less IDTs of the input IDTs 21 and output IDTs 22, and is not connected to the remaining IDTs. Thus, as illustrated in FIG. 7A, the amount of change in the frequency of the attenuation pole 60 with respect to the change in the inductance of the inductor L1 is reduced, and thus the attenuation pole 60 can be easily adjusted to be at a desired frequency by adjusting the inductance of the inductor L1. Further, as illustrated in FIG. 7B, it is possible to suppress deterioration in the attenuation in the stopband on the low-frequency side of the passband.

In the embodiment 1, the inductor L1 is connected to the output IDT 22a, which is located outermost in the X direction, and the input IDT 21a, which is located next to the output IDT 22a, and is not connected to the remaining IDTs. Thus, as illustrated in FIG. 7A, the amount of change in the frequency of the attenuation pole 60 with respect to the change in the inductance of the inductor L1 is reduced, and thus the attenuation pole 60 can be easily adjusted to be at a desired frequency by adjusting the inductance of the inductor L1. Further, as illustrated in FIG. 7B, the deterioration in the attenuation in the stopband on the low-frequency side of the passband can be suppressed. In addition, since the number of intersections between the wiring lines 12 connected to the ground and the wiring lines 12 connected to the input terminal Tin and the output terminal Tout is reduced, the influence of capacitive coupling between the signal wiring line and the ground wiring line can be suppressed.

In the embodiment 1 and the variations thereof, the inductance of the inductor L1 is 3 nH or less. Thus, as illustrated in FIG. 7A, the amount of change in the frequency of the attenuation pole 60 with respect to the change in the inductance of the inductor L1 is reduced, and thus the attenuation pole 60 can be easily adjusted to be at a desired frequency by adjusting the inductance of the inductor L1. Further, as illustrated in FIG. 7B, the deterioration in the attenuation in the stopband on the low-frequency side of the passband can be suppressed.

Embodiment 2

Figure 9A:
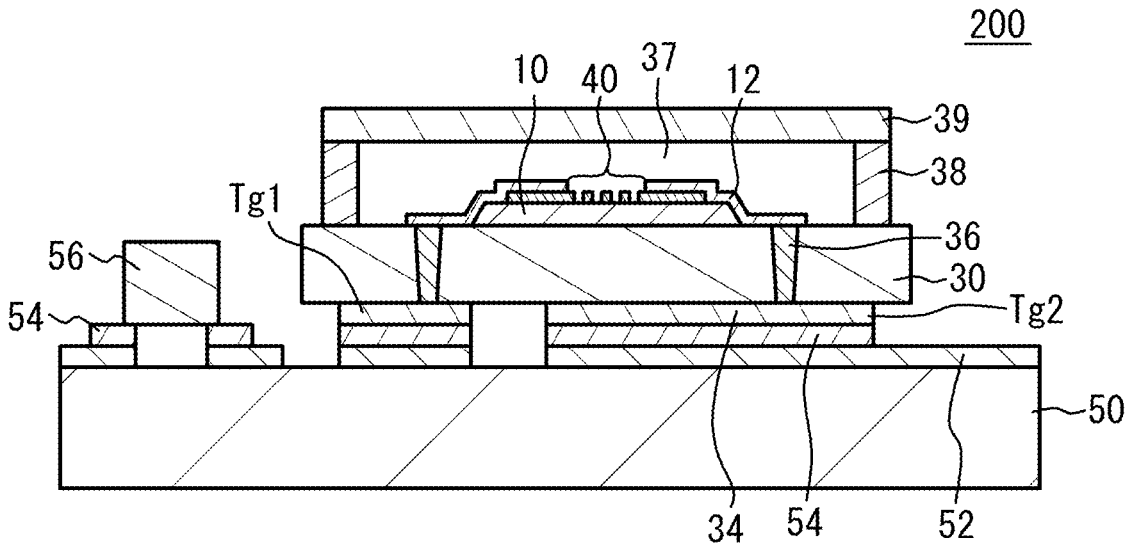
FIG. 9A and FIG. 9B are cross-sectional views of filters in accordance with an embodiment 2 and a variation of the embodiment 2, respectively.

FIG. 9A is a cross-sectional view of a filter 200 in accordance with an embodiment 2. As illustrated in FIG. 9A, the piezoelectric substrate 10 is bonded to the upper surface of the support substrate 30. The DMS 40 is provided on the upper surface of the piezoelectric substrate 10. A plurality of the terminals 34 are provided on the lower surface of the support substrate 30. The terminals 34 include the input terminal Tin, the output terminal Tout, and the ground terminals Tg1 and Tg2, as described in the embodiment 1. The DMS 40 is connected to the terminals 34 through the wiring lines 12 provided on the support substrate 30 and the via wirings 36 penetrating through the support substrate 30. The frame body 38 surrounding the piezoelectric substrate 10 is provided in the peripheral region of the support substrate 30. A lid 39 is provided on the frame body 38 so that a void space 37 is formed between the lid 39 and the piezoelectric substrate 10. The lid 39 is bonded to the frame body 38 by a bonding member such as gold-tin or tin-silver-copper. The DMS 40 is sealed in the void space 37 by the frame body 38 and the lid 39. The lid 39 includes a metal layer such as kovar, nickel, or copper.

The terminals 34 are bonded to terminals 52 of a wiring substrate 50 by joining members 54. Thus, the DMS 40 is mounted on the wiring substrate 50. The wiring substrate 50 is, for example, a printed circuit board (PCB substrate). A chip inductor 56 having the inductor L1 formed therein is mounted on the wiring substrate 50 by the joining member 54. Other configurations are the same as those of the embodiment 1, and thus the description thereof will be omitted.

Figure 9B:
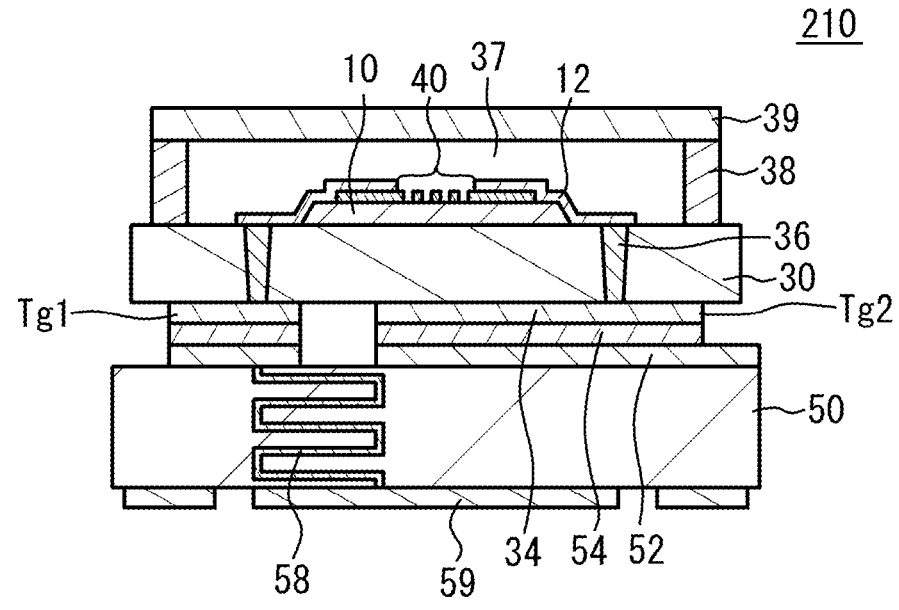

FIG. 9B is a cross-sectional view of a filter 210 in accordance with a variation of the embodiment 2. As illustrated in FIG. 9B, in the variation of the embodiment 2, no chip inductor is mounted on the wiring substrate 50. Instead, a line 58 forming the inductor L1 is provided on the wiring substrate 50. The line 58 is a conductor pattern and has, for example, a meander shape, but may have another shape such as a spiral shape or a linear shape. Terminals 59 are provided on the lower surface of the wiring substrate 50. Other configurations are the same as those of the embodiment 2, and thus the description thereof is omitted.

As in the embodiment 2, the inductor L1 may be formed of the chip inductor 56 mounted on the wiring substrate 50 (mounting substrate) on which the DMS 40 is mounted. As in the variation of the embodiment 2, the inductor L1 may be formed of the line 58 provided in the wiring substrate 50 (mounting substrate) on which the inductor DMS 40 is mounted.

Embodiment 3

Figure 10:
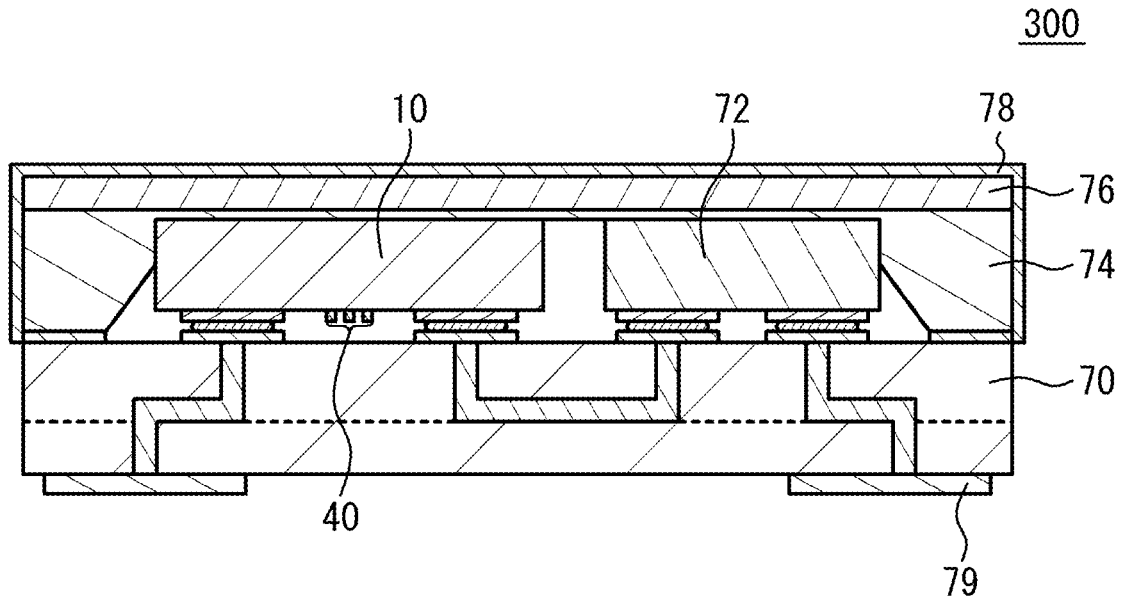
FIG. 10 is a cross-sectional view of a filter in accordance with an embodiment 3.

FIG. 10 is a cross-sectional view of a filter 300 in accordance with an embodiment 3. As illustrated in FIG. 10, the piezoelectric substrate 10 on which the DMS 40 is formed is flip-chip mounted on the upper surface of a package substrate 70. The piezoelectric substrate 10 may be bonded to the support substrate 30. A chip 72 in which the inductor L1 is formed is also mounted on the upper surface of the package substrate 70. The chip 72 is, for example, an intelligent power device (IPD) chip, but may be another chip. The package substrate 70 may be a printed circuit board. A sealing portion 74 surrounding the piezoelectric substrate 10 and the chip 72 in a plan view and a lid 76 provided on the sealing portion 74 are provided on the package substrate 70. The piezoelectric substrate 10, the DMS 40, and the chip 72 are sealed by the sealing portion 74 and the lid 76. A passivation layer 78, which is a metal layer such as nickel, may be provided on the surfaces of the sealing portion 74 and the lid 76. A plurality of terminals 79 are provided on the lower surface of the package substrate 70. Other configurations are the same as those of the embodiment 1, and thus the description thereof will be omitted.

As in the embodiment 3, the inductor L1 may be formed of the chip 72 mounted on the package substrate 70 (mounting substrate) on which the DMS 40 is mounted.

Embodiment 4

Figure 11:
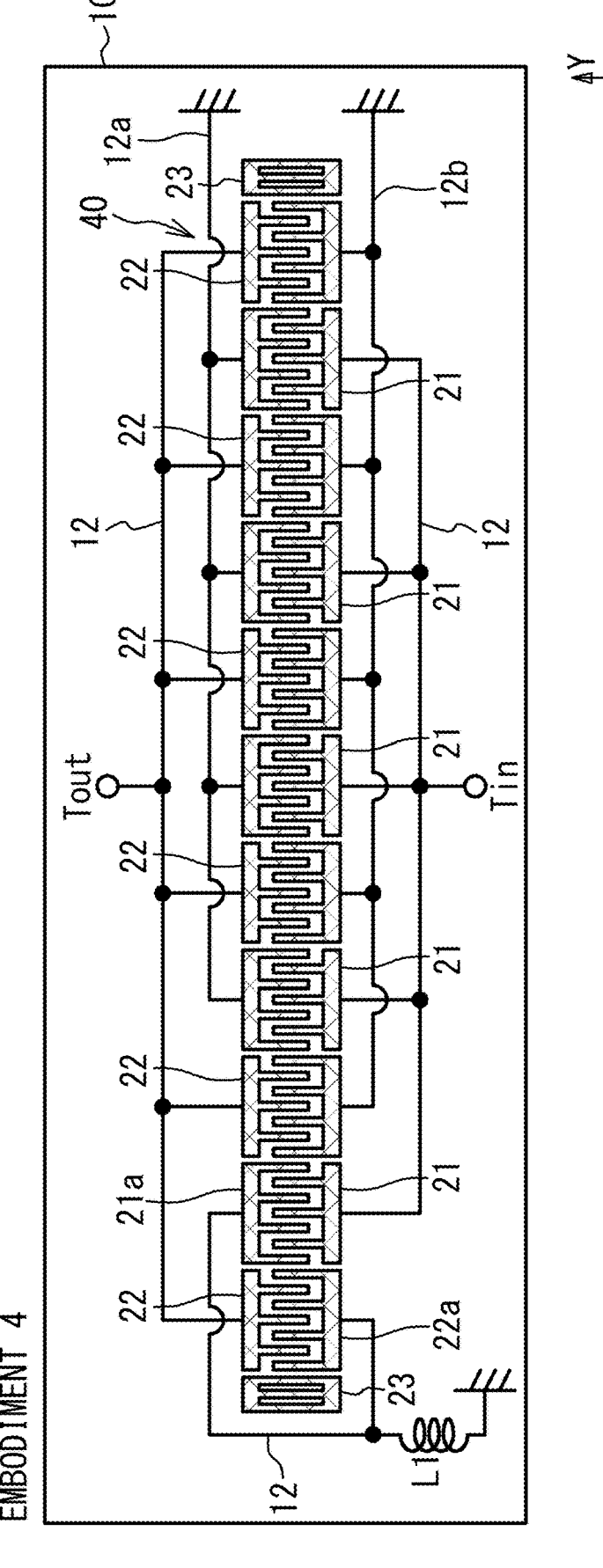
FIG. 11 is a plan view of a DMS in an embodiment 4.

FIG. 11 is a plan view of the DMS 40 in an embodiment 4. As illustrated in FIG. 11, in the embodiment 4, the remaining input IDTs 21 other than the input IDT 21a connected to the inductor L1 among the input IDTs 21 are connected to a ground by wiring lines 12a without passing through the inductor L1. The remaining output IDTs 22 other than the output IDT 22a connected to the inductor L1 among the output IDTs 22 are connected to a ground by wiring lines 12b without passing through the inductor L1. Other configurations are the same as those of the embodiment 1, and thus the description thereof will be omitted.

Figures 12A, 12B:
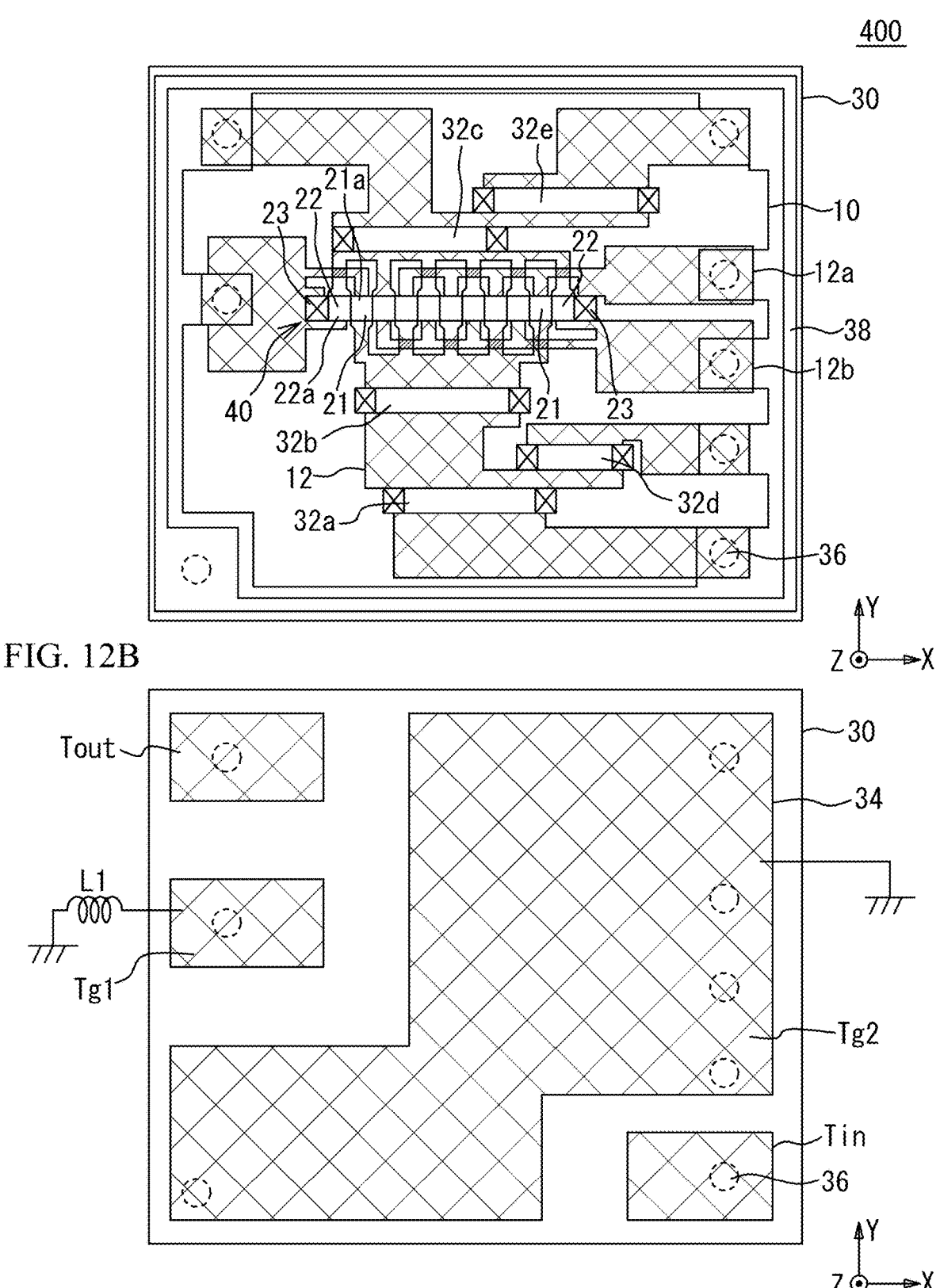
FIG. 12A is a plan view of a filter in accordance with the embodiment 4.
FIG. 12B is a plan view of the lower surface of a support substrate.

FIG. 12A is a plan view of a filter 400 in accordance with the embodiment 4, and FIG. 12B is a plan view of the lower surface of the support substrate 30. As illustrated in FIG. 12A and FIG. 12B, the remaining input IDTs 21 other than the input IDT 21a connected to the inductor L1 among the input IDTs 21 are connected to the ground terminal Tg2 through the wiring lines 12a and the via wirings 36. The remaining output IDTs 22 other than the output IDT 22a connected to the inductor L1 among the output IDTs 22 are connected to the ground terminal Tg2 through the wiring lines 12b and the via wirings 36. The wiring lines 12a and 12b are separated from each other on the piezoelectric substrate 10 and the support substrate 30, and are not in contact with each other. Other configurations are the same as those of the embodiment 1, and thus the description thereof will be omitted.

Simulation 3

FIG. 13A and FIG. 13B are plan views of models 1 and 2 on which simulations were performed, respectively. As illustrated in FIG. 13A, in the model 1, the wiring lines 12 connected to the input IDTs 21 and the output IDTs 22, respectively, are combined into one and connected to a ground. An unnecessary parasitic inductance may be generated between the input IDTs 21 and the ground and between the output IDTs 22 and the ground due to various factors. Therefore, the model 1 assumes that a parasitic inductor L2 is formed between the ground and the input IDTs 21 and output IDTs 22.

As illustrated in FIG. 13B, in the model 2, the wiring lines 12 connected to the input IDTs 21, respectively, are combined into one and connected to a ground. Similarly, the wiring lines 12 connected to the output IDTs 22, respectively, are combined into one and connected to another ground. The model 2 also assumes that parasitic inductor L2 is formed between the input IDTs 21 and the ground and the parasitic inductor L2 is formed between the output IDTs 22 and the ground.

The transmission characteristics of the DMDs 40 in the model 1 and the model 2 were simulated. The simulation conditions are as follows.

Piezoelectric substrate 10: 42°-rotated Y-cut X-propagation lithium tantalate substrate Metal film 11: Aluminum film with a thickness of 131 nm Number of the input IDTs 21: 5

Number of the output IDTs 22: 6

Inductance of the parasitic inductor L2: 0 nH, 0.1 nH, 0.2 nH

Passband: Reception band of Band 66 (2110 MHz to 2200 MHz)

Figure 14A:
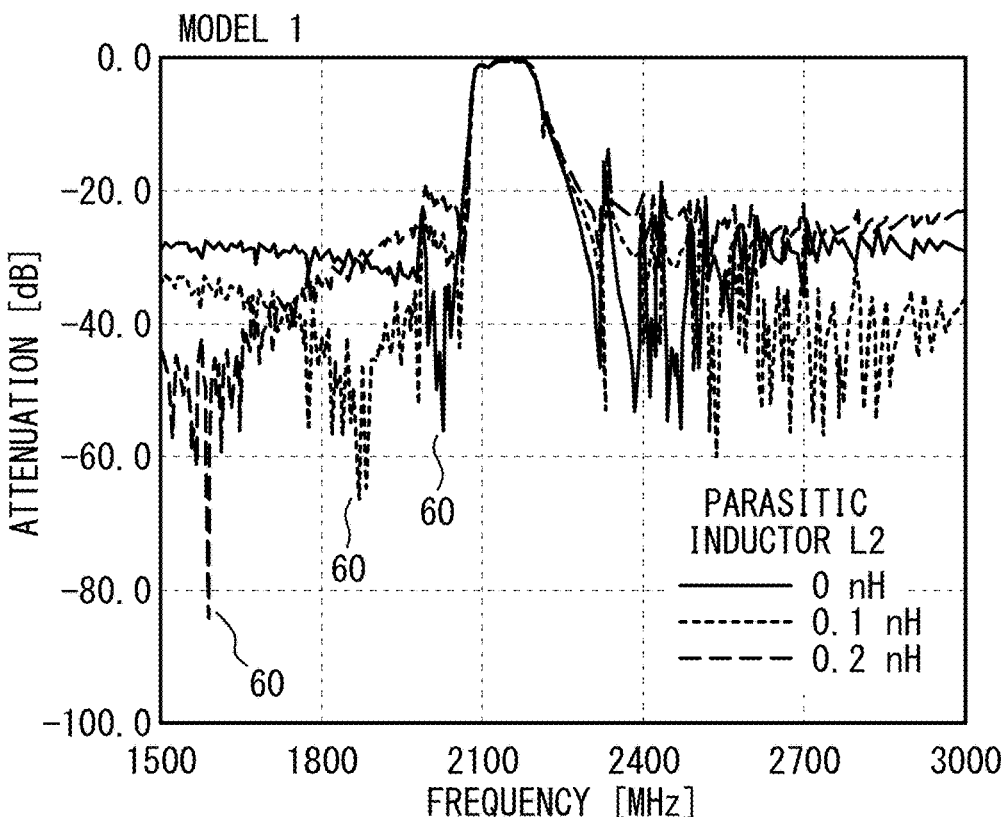
FIG. 14A and FIG. 14B present simulation results of attenuation versus frequency in the models 1 and 2, respectively.
Figure 14B:
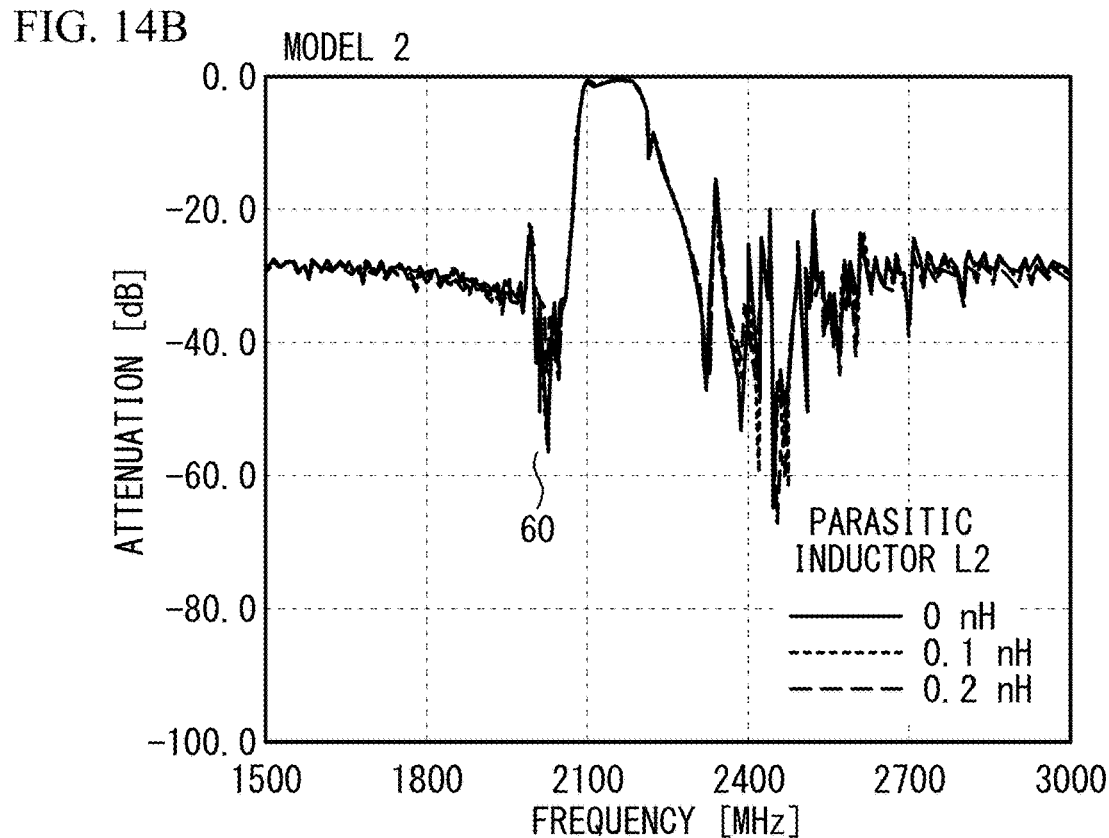

FIG. 14A presents simulation results of attenuation versus frequency in the model 1. FIG. 14B presents simulation results of attenuation versus frequency in the model 2. As presented in FIG. 14A, in the model 1, the frequency of the attenuation pole 60 on the low-frequency side of the pass-band vary in accordance with the inductance of the parasitic inductor L2. As presented in FIG. 14B, in the model 2, even when the inductance of the parasitic inductor L2 varies, the frequency of the attenuation pole 60 on the low-frequency side of the passband hardly varies.

This reveals that combining the wiring lines 12 connected to the input IDTs 21, respectively, into one and connecting it to a ground and, independently, combining the wiring lines 12 connected to the output IDTs 22, respectively, into one and connecting it to another ground suppresses the influence on the attenuation characteristics on the low-frequency side of the passband even when the parasitic inductor L2 is formed.

In the embodiment 4, as illustrated in FIG. 12A, the remaining input IDTs 21 other than the input IDT 21*a* connected to the inductor L1 among the input IDTs 21 are connected to a ground by the wiring lines 12*a* (first wiring lines). The remaining output IDTs 22 other than the output IDT 22*a* connected to the inductor L1 among the output IDTs 22 are connected to a ground by the wiring lines 12*b* (second wiring lines) separated from the wiring lines 12*a* on the piezoelectric substrate 10. Thus, even when a parasitic inductance is generated, the influence of the parasitic inductance on the attenuation characteristics on the low-frequency side of the passband is suppressed. Therefore, the attenuation characteristics on the low-frequency side of the pass-band can be improved.

Embodiment 5

Figure 15:
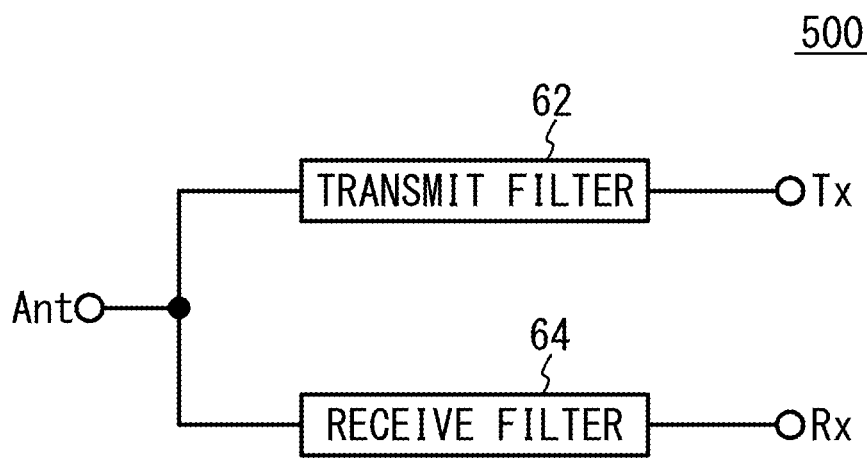
FIG. 15 is a circuit diagram of a duplexer in accordance with an embodiment 5.

FIG. 15 is a circuit diagram of a duplexer 500 in accordance with an embodiment 5. As illustrated in FIG. 15, a transmit filter 62 is connected between a common terminal Ant and a transmit terminal Tx. A receive filter 64 is connected between the common terminal Ant and a receive terminal Rx. The transmit filter 62 transmits signals in the transmission band to the common terminal Ant as transmission signals among high-frequency signals input from the transmit terminal Tx, and suppresses signals with other frequencies. The receive filter 64 transmits signals in the reception band to the receive terminal Rx as reception signals among high-frequency signals input from the common terminal Ant, and suppresses signals with other frequencies. At least one of the transmit filter 62 or the receive filter 64 may be any one of the filters of the embodiments 1 to 4. Although the duplexer is described as an example of the multiplexer, the multiplexer may be a triplexer or a quadplexer.

Although the embodiment of the present disclosure has been described in detail above, the present disclosure is not limited to the specific embodiment, and various modifications and changes can be made within the scope of the gist of the present disclosure described in the claims.

What is claimed is:

1. A filter comprising:
a piezoelectric substrate;
a multimode filter provided on the piezoelectric substrate, the multimode filter including input IDTs and output IDTs, the input IDTs being connected to an input terminal, the output IDTs being connected to an output terminal and arranged alternately with the input IDTs; and
an inductor having a first end, which is connected to two or more and half or less IDTs of the input IDTs and the output IDTs, and a second end connected to a ground, the two or more and half or less IDTs including at least one input IDT of the input IDTs and at least one output IDT of the output IDTs.

2. The filter according to claim 1, wherein the first end of the inductor is connected to two or more and three or less IDTs of the input IDTs and the output IDTs, and is not connected to a remaining IDT.

3. The filter according to claim 1, wherein the first end of the inductor is connected to a first IDT, which is located outermost among the input IDTs and the output IDTs in a direction in which the input IDTs and the output IDTs are arranged, and a second IDT, which is next to the first IDT, and is not connected to a remaining IDT.

4. The filter according to claim 2, wherein an inductance of the inductor is 3 nH or less.

5. The filter according to claim 1, further comprising:
a first wiring line that is provided on the piezoelectric substrate and connects a remaining input IDT other than the at least one input IDT of the input IDTs to a ground; and
a second wiring line that is provided on the piezoelectric substrate, is separated from the first wiring line on the piezoelectric substrate, and connects a remaining output IDT other than the at least one output IDT of the output IDTs to a ground.

6. The filter according to claim 1, further comprising:
a mounting substrate on which the multimode filter is mounted; and
a chip that is mounted on the mounting substrate and has the inductor formed therein.

7. The filter according to claim 1, further comprising:
a mounting substrate on which the multimode filter is mounted; and
a line that is provided in the mounting substrate and forms the inductor.

8. A multiplexer comprising the filter according to claim 1.

* * * * *